United States Patent
Nonaka et al.

(10) Patent No.: US 6,920,364 B2
(45) Date of Patent: Jul. 19, 2005

(54) WORK ASSISTANCE APPARATUS AND MEMORY MEDIUM FOR USE THEREIN

(75) Inventors: Norihiko Nonaka, Chiyoda (JP); Hiromitsu Tokisue, Chiyoda (JP); Ichiro Nishigaki, Ishioka (JP); Makoto Onodera, Tsuchiura (JP)

(73) Assignee: Hitachi, Ltd., Tokyo (JP)

( * ) Notice: Subject to any disclaimer, the term of this patent is extended or adjusted under 35 U.S.C. 154(b) by 119 days.

(21) Appl. No.: 10/369,689

(22) Filed: Feb. 21, 2003

(65) Prior Publication Data

US 2004/0024479 A1 Feb. 5, 2004

(30) Foreign Application Priority Data

Jul. 31, 2002  (JP) ...................................... 2002-222349

(51) Int. Cl.[7] .............................................. G06F 19/00
(52) U.S. Cl. ........................... 700/97; 700/98; 700/104; 700/118; 700/163; 345/419; 345/420; 717/1; 717/100; 717/102
(58) Field of Search ........................... 700/97, 98, 104, 700/118, 163; 345/418, 419, 420; 717/1, 100, 102

(56) References Cited

U.S. PATENT DOCUMENTS

| | | | |
|---|---|---|---|
| 6,377,956 B1 * | 4/2002 | Hsu et al. ................ | 707/104.1 |
| 6,606,740 B1 * | 8/2003 | Lynn et al. ................ | 717/100 |
| 2002/0196250 A1 * | 12/2002 | Anderson et al. ........... | 345/420 |
| 2003/0144758 A1 * | 7/2003 | Duggirala ................... | 700/104 |
| 2003/0200527 A1 * | 10/2003 | Lynn et al. ................. | 717/102 |
| 2004/0078212 A1 * | 4/2004 | Andersson et al. ............ | 705/1 |
| 2004/0128613 A1 * | 7/2004 | Sinisi ......................... | 715/500 |

FOREIGN PATENT DOCUMENTS

JP     2001-147950 A     5/2001

* cited by examiner

*Primary Examiner*—Ramesh Patel
(74) *Attorney, Agent, or Firm*—Mattingly, Stanger, Malur & Brundidge, P.C.

(57) ABSTRACT

A work assistance apparatus executes software programs necessary for works with using a computer, files generated in plural number thereof, and know-how data, with high efficiency. For that purpose, the work assistance apparatus includes a common template production portion for producing a common template, in which common information is defined, such as, steps of work, the software programs, and the know-how, etc.; a template execution portion for executing the work in accordance with the template; and a difference template production portion for producing information not defined in the common template in a form of a difference template. In the work with using the common template, information newly added is accumulated into the difference template.

6 Claims, 12 Drawing Sheets

FIG. 6

| Common Template Data |||
|---|---|---|
| Common Template Name : Regular Analysis |||
| Process Name: Model Production<br>Program : 3D-CAD<br>Input File :<br>Output File : 3DOut || Reference File : Production Method<br>Reference Program : Web Brower |
| Process Name: Definition of<br>Analysis Condition<br>Program : PreProcessor<br>Input File : 3DOut<br>Output File : PrOut || Reference File : Definition Method<br>Reference Program : Web Brower |
| Process Name: Analysis Program<br>Program : Analysis<br>Input File : PrOut<br>Output File : AnOut || Reference File :<br>Reference Program : |
| Process Name: Evaluation of<br>Analysis Result<br>Program : PostProcessor<br>Input File : AnOut<br>Output File : || Reference File :<br>Reference Program : Web Brower |
| Step Definition<br>　├─ Model Production<br>　├─ Definition of Analysis Condition<br>　├─ Analysis<br>　└─ Evaluation of Analysis Result |||

FIG. 7

Keyword Data

Common Template Name : Regular Analysis

Keyword : Part A, G1, TARO

Difference Template Name :
  Keyword :

Difference Template Name :
  Keyword :

FIG. 9

Please Select Keyword

Common Template Name : Regular Analysis

Difference Template Name : Part A_1

Keyword List

Part A
G1
TARO

Selection List

Part A
G1

FIG. 10

| Difference Template Data ||
|---|---|
| Difference Template Name : Part A_1 ||
| Process Name: Model Production<br>Input File : Part A1 | Reference File : Input Part Information<br>Reference Program : Editor |
| Process Name: Definition of Analysis Condition | Reference File :<br>Reference Program : |
| Process Name: Analysis | Reference File :<br>Reference Program : |
| Process Name: Evaluation of Analysis Result<br>Output File : Result 1 | Reference File : Part Evaluation A1<br>Reference Program : Common |

FIG. 11

```
┌─────────────────────────────────────────────┐
│              Keyword Data                   │
├─────────────────────────────────────────────┤
│  Common Template Name : Regular Analysis    │
│    Keyword : Part A, G1, TARO               │
│                                             │
│    Difference Template Name : Part A_1      │
│      Keyword : Part A, G1                   │
│                                             │
│    Difference Template Name : Part A_2      │
│      Keyword : Part A, G1                   │
│                                             │
│    Difference Template Name : Part A_3      │
│      Keyword : Part A, G1                   │
│                                             │
│    Difference Template Name : Part A_4      │
│      Keyword : Part A, G1                   │
│                                             │
│    Difference Template Name : Part A_A      │
│      Keyword : Part A, TARO                 │
│                                             │
│    Difference Template Name : Part A_B      │
│      Keyword : Part A, TARO                 │
│                                             │
│    Difference Template Name : Part A_C      │
│      Keyword : Part A, TARO                 │
└─────────────────────────────────────────────┘
```

FIG. 13

Data List

Common Template Name: Common Analysis
Selection Keyword: Part A, G1

| | Common Template | Part A_1 | Part A_2 | Part A_3 | Part A_4 |
|---|---|---|---|---|---|
| Process | Model Production | — | — | — | — |
| ENG Tool | 3D-CAD | — | — | — | — |
| Input File | | Part A1 | Part A2 | Part A3 | Part A4 |
| Output File | 3DOut | — | — | — | — |
| Reference File | Production Method | Part Information A | Part Information B | Size Value Information | — |
| Reference Program | Web Brower | Editor | Editor | — | — |
| Process | Definition of Analysis Condition | — | — | — | — |
| ENG Tool | PreProcessor | — | — | — | — |
| Input File | 3DOut | — | — | — | — |
| Output File | PreOut | — | — | — | — |
| Reference File | Definition Method | — | — | — | — |
| Reference Program | Web Brower | — | — | — | — |
| Process | Analysis | — | — | — | — |
| ENG Tool | Analysis | — | — | — | — |
| Input File | PreOut | — | — | — | — |
| Output File | AnOut | — | — | — | — |
| Reference File | | — | — | — | — |
| Reference Program | | — | — | — | — |
| Process | Evaluation of Analysis Result | — | — | — | — |
| ENG Tool | PreProcessor | — | — | — | — |
| Input File | AnOut | — | — | — | — |
| Output File | | Result 1 | Result 2 | Result 3 | Result 4 |
| Reference File | | Part Evaluation A1 | Part Evaluation A2 | Part Evaluation A3 | Part Evaluation A4 |
| Reference Program | Web Brower | — | — | — | — |

WORK ASSISTANCE APPARATUS AND MEMORY MEDIUM FOR USE THEREIN

BACKGROUND OF THE INVENTION

The present invention relates to a work assistance system by using a computer therein.

In general, analyzing work is conducted with using CAE (Computer Aided Engineering), by conducting a series of operations; such as, producing a configuration model to be a target of analysis, producing analysis mesh, defining the condition of analysis, execution of the analysis, and further visualizing an analysis result and/or an evaluation thereof, via executing the respective software programs thereof, sequentially, for example. Ordinarily, when putting the CAE into practical use of design work, such the analyzing work as mentioned above is conducted, not only one (1) time, but is repeated by a large number of times, in particular for obtaining parametric survey, while altering or changing the configuration model in various manners, thereby extracting one from the analysis results obtained, which can satisfy the design specification.

Conventionally, a technology for assisting such the repetitive analyzing work is known, as being described in Japanese Patent Laying-Open No. 2001-147950 (JP-A 147950 (2001)), for example. Namely, the configure data is produced for use in the CAE for analyzing on the basis of CAD data, and the analysis is executed upon the basis of this configure data, thereby determining the analysis results. In this instance, for example, when satisfaction cannot be obtained in the strength, etc., the CAE configuration data is altered or changed, and then is analyzed, again, so as to execute the series of analyzing operations until when satisfaction can be obtained. The change is made on the configuration data, for use in the CAE, by an engineer who is making the analysis thereon. Then, he/she makes correction or amendment on the CAD data upon the basis of the CAE configuration obtained, when deciding to obtain the satisfactory CAE configuration.

The analyzing operations includes, as was mentioned in the above, producing the configuration model for analysis, producing the mesh model for analysis through dividing the configuration model into the mesh, and executing the analysis thereupon. In this instance, if trying to change the model configuration due to unsatisfactory strength thereof, etc., then it causes differences in a portion to be changed on the model configuration, a manner of stretching the mesh, and various kinds of parameters, which changes delicately accompanying with the change, for each one analyses.

However, with the conventional technology mentioned above, since those various kinds of changes, such as, the change on the configuration and those accompanying therewith, are left to the engineer who is making analysis, then he/she must make the analysis many times, by changing input data, such as, the configuration data and the analysis condition thereof, etc., when executing the parametric survey, in which the calculation is conducted repeatedly. If the calculation condition differs in this instance, an input/output file necessary for the analysis program also must be different from. And, only one is provided as the final CAD data, which is finally decided in conformity with the condition, such as the strength, etc., but no reservation is made on the analyzing results, which accompanies with the changes of configuration data, and/or the data on the way of the calculation thereof, therefore it is impossible to see or understand a degree and so on, in particular, of distribution by the configuration changes onto the analyzing result. For this reason, if trying to make analysis on the degree of distribution by the configuration changes, which are conducted repeatedly, it is necessary to make a production of the analysis data and/or a copy thereof, for each one analysis event in the parametric survey, and therefore it results in that the analysis data exists in a large number thereof, which are highly similar to each other, such as, the analyzing results when changing the sizes of the target model for analysis or the like, for example. This makes management of such the analyzing data difficult.

Further, alternation or changing of the model configuration, the manner of stretching the mesh, and/or the delicate changes in the analysis conditions, etc., are made upon the basis of the engineer who is making analysis, therefore it is difficult to obtain the same results if he/she takes other's place.

BRIEF SUMMARY OF THE INVENTION

An object is, according to the present invention, to provide an assistance apparatus for assisting work with using a computer.

The object mentioned above, according to the present invention, is accomplished by a work assistance apparatus with using a computer therein, including a common template producing portion for producing a common template, in which work is defined for each process along with steps thereof; and a difference template producing portion for recording information therein, being necessary for advancing the work but not described in said common template, for each of said processes.

Also, the object mentioned above, according to the present invention, is accomplished by a work assistance apparatus with using a computer therein, including a common template producing portion for producing a common template, in which work is defined for each process along with steps thereof; a difference template producing portion, for recording information, being necessary for advancing the work but not described in said common template, for each of said processes; and a means for memorizing a keyword for relating between said common template and said difference template.

Also, the object mentioned above, according to the present invention, is accomplished by a work assistance apparatus with using a computer therein, including a common template producing portion for producing a common template, in which work is defined for each process along with steps thereof; a difference template producing portion, for recording information, being necessary for advancing the work but not described in said common template, for each of said processes; a means for memorizing a keyword for relating between said common template and said difference template; and a means for displaying content(s) of one (1) or plural numbers of difference templates, which is/are searched out by means of said keyword, in a form of a list thereof.

Further, according to the present invention, the object mentioned above is also accomplished by a memory medium for use with a computer, memorizing therein information for performing predetermined means with an aid of said computer including a common template producing portion for producing a common template, in which information necessary for work is defined for each process along with work steps thereof; a template execution means for executing the work with using said common template; and a difference template producing means for producing a difference template by taking information therein, not described in said common template, as a result of execution of the work.

Further, according to the present invention, the object mentioned above is also accomplished by a memory medium for use with a computer, memorizing therein information for performing predetermined means with an aid of said computer, comprising: a common template producing portion for producing a common template, in which information necessary for work is defined for each process along with work steps thereof; a template execution means for executing the work with using said common template; a difference template producing means for producing a difference template by taking information therein, not described in said common template, as a result of execution of the work; a common keyword setting portion for giving a keyword to said common template; and a difference keyword setting portion for giving a keyword to said difference template.

And, according to the present invention, the object mentioned above is also accomplished by a memory medium for use with a computer, memorizing therein information for performing predetermined means with an aid of said computer including a display including a common template producing portion for producing a common template, in which information necessary for work is defined for each process along with work steps thereof; a template execution means for executing the work with using said common template; a difference template producing means for producing a difference template by taking information therein, not described in said common template, as a result of execution of the work; a common keyword setting portion for giving a keyword to said common template; a difference keyword setting portion for giving a keyword to said difference template; and a template information display portion for displaying content(s) of at least one (1) or plural numbers of the difference template(s), which is/are searched out by means of said keyword, in a form of a list thereof.

BRIEF DESCRIPTION OF THE SEVERAL VIEWS OF THE DRAWING

FIG. 6 is a view for showing an example of the data structure of the common template;

FIG. 7 is a view for showing an example of the data structure of the keyword;

FIG. 9 is a view for showing an example of an display screen for inputting the keyword connecting the common or difference templates;

FIG. 10 is a view for showing an example of the data structure of the difference template;

FIG. 11 is a view for showing an example of the structure of the keyword;

FIG. 13 is a view for showing an example of the display screen of the template data collected.

DETAILED DESCRIPTION OF THE INVENTION

Figure 1:
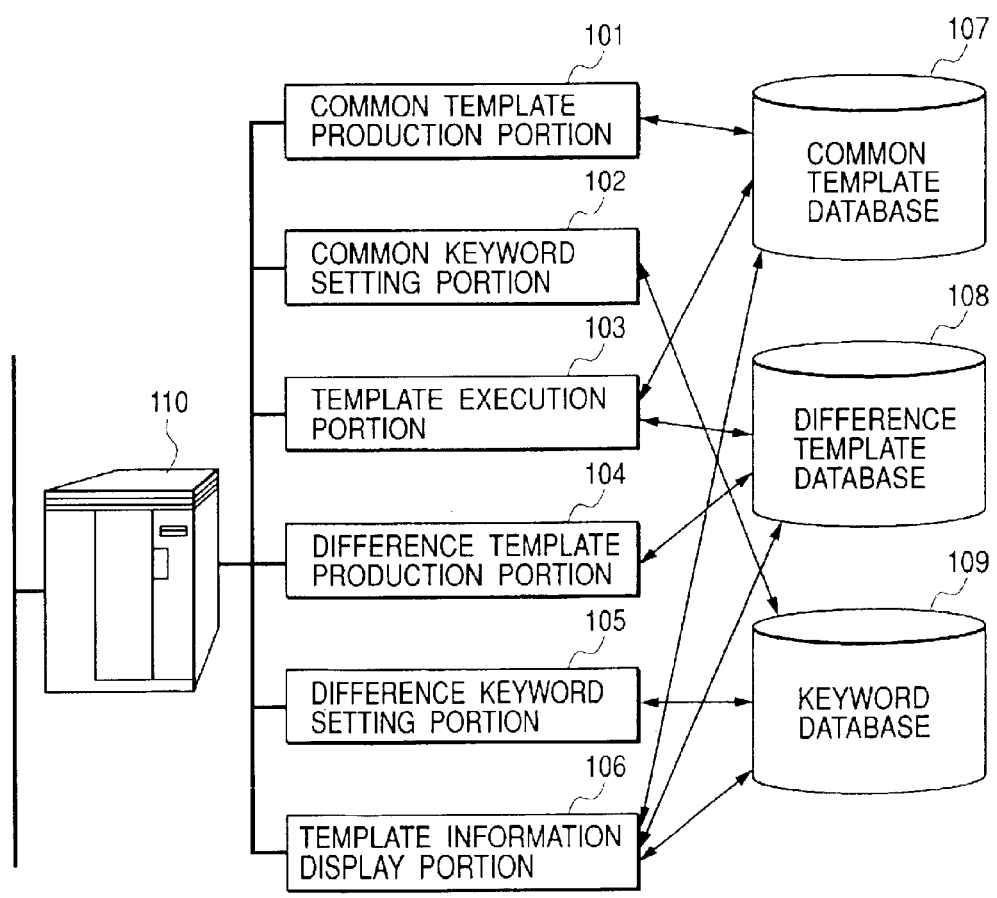
FIG. 1 is a view for showing the entire structure of an apparatus, according to the present invention.

The present invention relates to a technology and a method for using a digital engineering, being represented by CAE (Computer Aided Engineering), for example, for carrying out the design work, and in particular, to an analysis work assistance apparatus and a method thereof, for managing and classifying the know-how data necessary for guidance of analyzing steps and analyzing thereof, as well as, the data of analysis results, effectively, in the analyzing work for the parametric survey, which necessitates execution of analysis in a plural number thereof. Hereinafter, embodiments according to the present invention will be fully explained, by referring to the drawings attached herewith.

FIG. 1 is a block diagram of showing the system construction of one embodiment of an analysis work assistance apparatus, according to the present invention. The analysis work assistance apparatus, being the embodiment shown in FIG. 1 includes a common template production portion 101, a common keyword setting portion 102, a template execution portion 103, a difference template production portion 104, a difference keyword setting portion 105, a template information display portion 106, a common template database 107, a difference template database 108, a keyword database 109, and a computer 110.

The common template production portion 101 defines information, being necessary for analyses; such as, steps of analysis, software program necessary for the analysis and/or an input/output file, a know-how information file, and/or a reference program thereof, etc. The data defined herein is called by "common template".

In the common keyword setting portion 102, keywords are inputted, each of which connects or links between the common template produced in the common template producing portion 101 and other template or file, etc.

The template execution portion 103, inputting the common template therein, conducts an analyzing operation upon the basis of the information described on the common template, according to the present embodiment. It is also able to conduct the analyzing operation, by inputting therein a difference template and the common template(s), to which the difference template refers with.

The difference template production portion 104 produces data, such as, an analysis result and an evaluation information, etc., in a form of the difference template, to be newly added in the analyzing operations executed in the template executing portion 103.

Namely, the common template is such that it describes data to be used in common by everyone, such as, the steps of analysis, the software programs necessary for the analysis, etc., for example, in particular, in case of conducting analysis repeatedly, while a portion thereof is defined to be in a form of the difference template, not being common with, i.e., uncommon, respect to the common data, such as, the analysis result, the evaluation of analysis result, and an opinion of a user, etc., to be different for each analysis.

The difference keyword setting portion 105 determines a keyword to be connected or linked with the difference template, from the keywords linked with the common template, which are used in the template execution portion. The template information display portion 106 receives the template information linked with the keyword from the common template database 107 and the difference template database 108, with using the keyword database 109, and outputs a list of the template information.

The common template database 107 manages data of the templates produced in the common template production portion 101. The difference template database 108 manages data of the difference templates produced in the difference template production portion.

The keyword database 109 manages the common templates, which are defined in the common keyword setting portion 102 and the difference keyword set portion 105, and a keyword information linked with the difference templates. In this instance, it also manages data addresses and reference relationships of the difference templates in relation to the common templates through the keywords. The computer 110 controls the elements 101 to 109, which build up the present apparatus.

Figure 2:
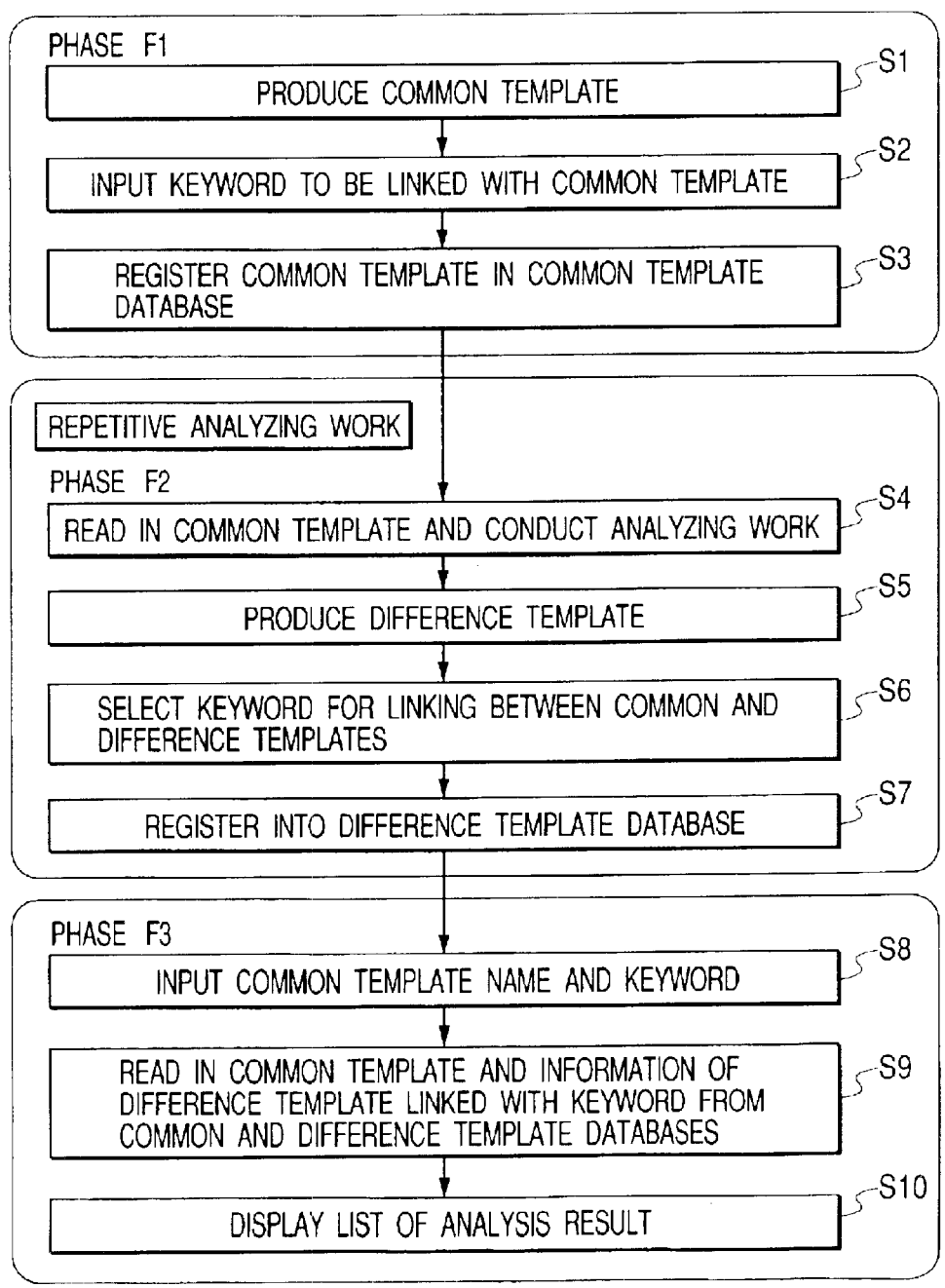
FIG. 2 is a view for showing steps of using the apparatus, according to the present invention.

Next, explanation will be given on processing steps in the apparatus of the present embodiment, being so structured as was mentioned in the above, by referring to FIGS. 2 through 13. FIG. 2 is a flowchart for showing the steps of using the analysis work assistance apparatus shown in FIG. 1. The steps of using can be roughly divided into three (3), according to the present embodiment.

First, the common templates are produced in the analyzing steps, which are conducted regularly. In this instance, definitions are made on the information necessary for analysis, such as, the analyzing steps, the software programs and/or an input/output file necessary for analyzing, and the know-how information or the reference programs, etc. And, the definition is made on the keyword to be linked with the common template. This is called by a phase F1.

Second, analysis is carried out, by using the common template. In the operations herein, the software programs are executed in accordance with the common analysis template, and the analyzing operations are conducted, by referring to the know-how information. And, the information other than those, which are defined in the common template, such as, the analysis result and the evaluation result, etc., are defined to be the difference template. In this instance, a keyword is selected from those, which are linked with the common template, for making a linkage or connection between the common template and the difference template. This is called by a phase F2. Further, this phase F2 is a phase, wherein the analyzing is repeated accompanying with changes in the sizes, and so on, of the target model of analysis, for the purpose of parametric survey, though being same or similar to the target of analysis and the steps of analysis.

Lastly, the information, which is added to the template, is listed up and displayed, by using the keyword linked with the common template and the difference template. This is called by a phase F3.

Figure 3:
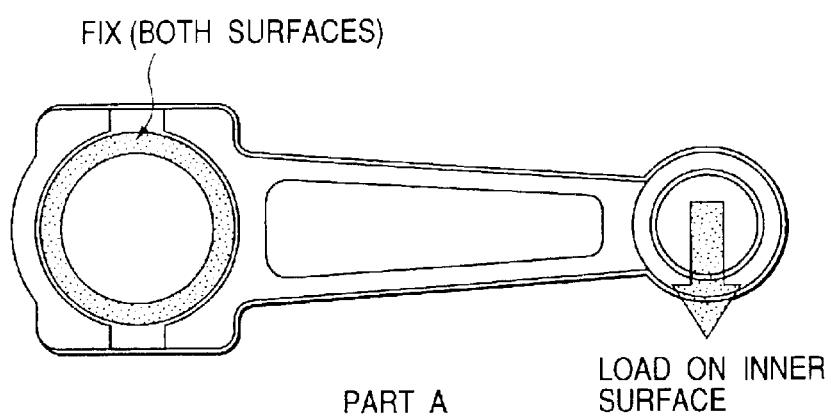
FIG. 3 is a view for showing analyzing work, in particular on a part A.
Figure 4:
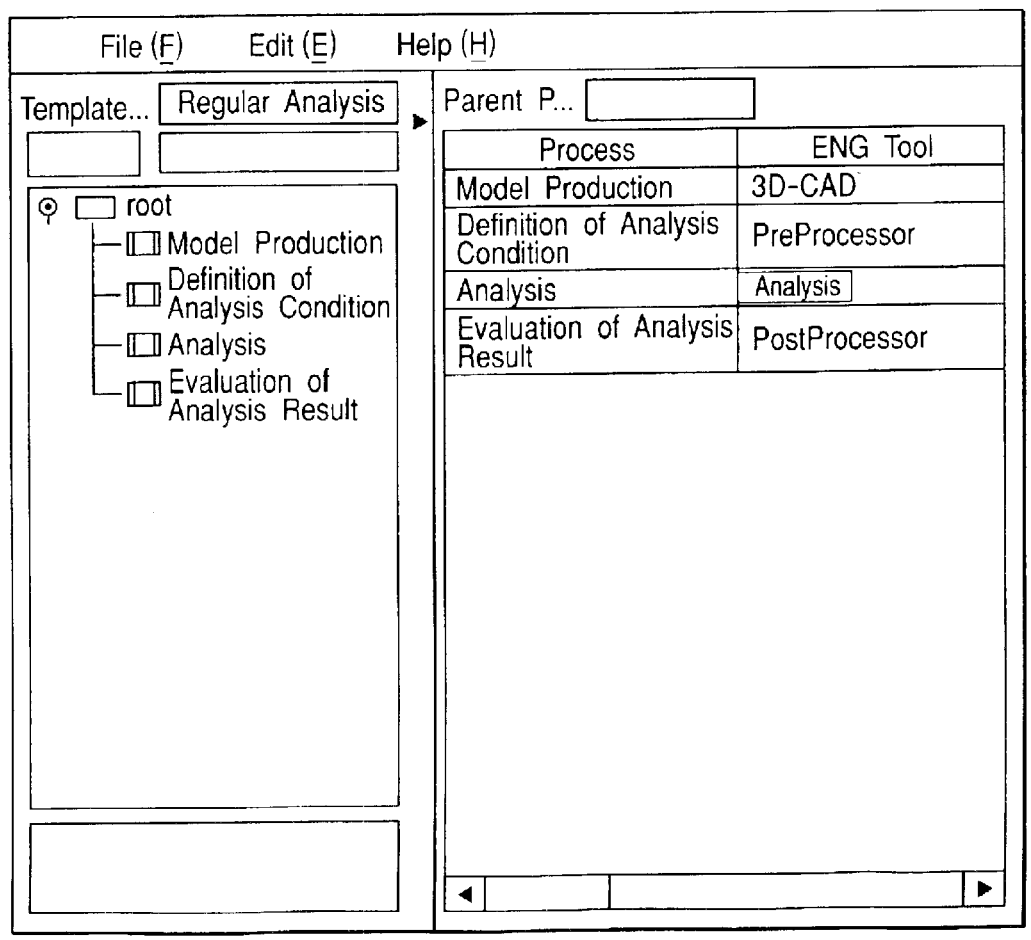
FIG. 4 is a view for showing an example of display screen for producing a common template.

Hereinafter, explanation will be given on execution of analyzing work, with using the apparatus according to the present embodiment, and in particular, about analyzing operations on a part A, as shown in FIG. 3, for example. In the phase F1, first, the common template is produced in the common template production portion in a step S1. FIG. 4 shows an example of a screen for producing the common template. Herein, definition is made on representative one of analyzing operations executed regularly, in relation to the part A. As is shown in the figure, "Model Production"→"Definition of Analysis Condition"→"Analysis"→"Evaluation of Analysis Result" is defined, as the analysis steps, and a producer of the common template makes the definition upon the software program(s), to be used in the respective one of the steps, such as, "3D-CAD", "PreProcessor", "Analysis" and "PostProcessor", for example. It is also possible to make definition upon the input/output file, the know-how reference information, and the reference program thereof, onto the common template. It is further possible to extend handling techniques to other users, by restoring the information (know-how) of a predecessor; such as, relating to a peculiar or specific manner in handling of the "PreProcessor", for example, and a file(s) thereof, describing therein the convenient functions when producing the model for use in analysis with stretching the mesh thereon, as well as, the cases when it cannot be done well, etc., within a folder of "Model Production". Also, this common template is called by a name, "Regular Analysis", herein.

Figure 5:
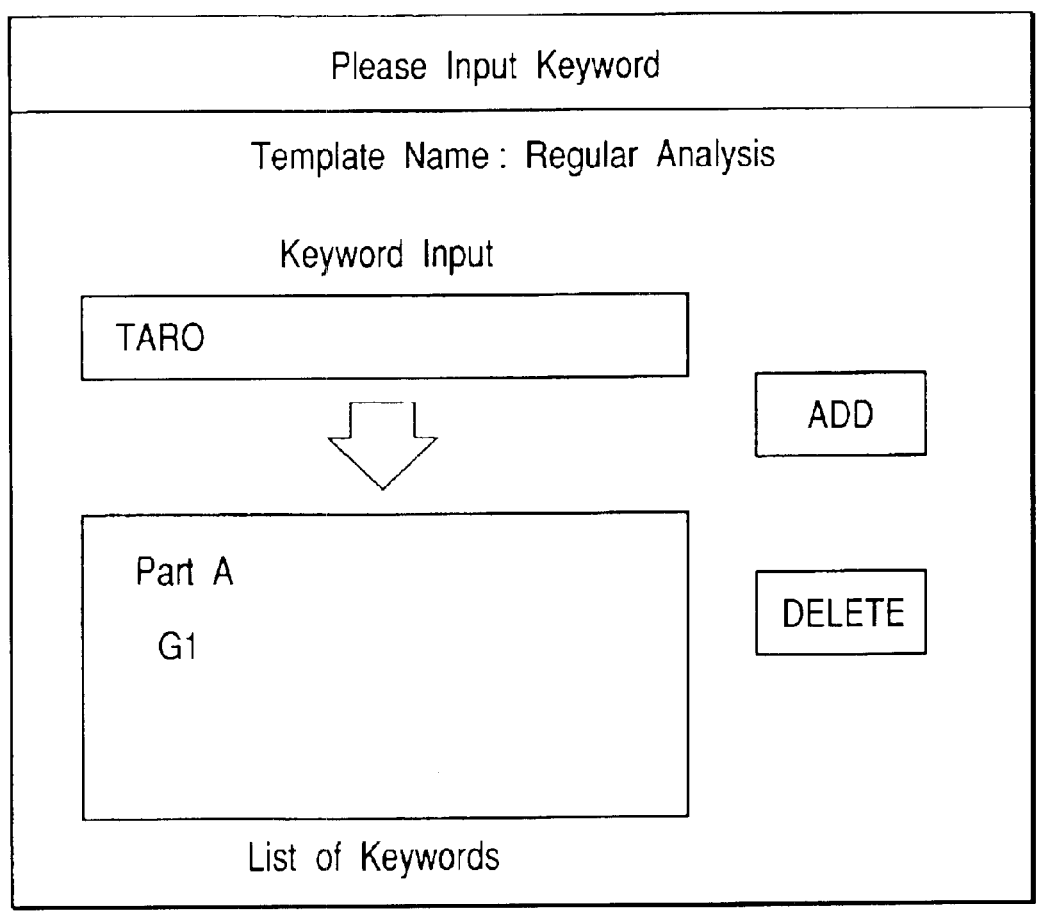
FIG. 5 a view for showing an example of display screen for inputting a keyword connecting the common templates.

Next, the keyword is defined in the common keyword setting portion, to be linked with the common template, in a step S2. FIG. 5 shows an example of a screen for inputting the keyword. The "Regular Analysis", which is defined in the step S1, is displayed as to be a name of the common template, to be linked with the keyword. Also, it is just on the way of inputting a present keyword "TARO", as the keyword input, and the "TARO" is registered as the keyword if an "ADD" button is pushed down. The keywords registered are displayed on a list of keywords, and there are registered "PART A" and "G1" at the present. It is also possible to delete the keyword, by using a delete button.

In the step S2, three (3) pieces of the keywords, e.g., "Part A", "G1" and "TARO" are linked with the common template "Regular Analysis". In a step 3, the common template and the keywords, which are defined in the steps S1 and S2, are registered into the common template database and the keyword database, respectively.

FIG. 6 shows an example of the data structure of the common template, and FIG. 7 an example of the data structure of the keyword, respectively. On the data structure of the common template, there are described a common template name, a process name of steps, a software program to be used in the process and an input/output file thereof, and a reference file of know-how necessary for the analysis and the software program(s) thereof. Herein, each of "Process", "ENG Tool", "Input File", "Output File", "Reference File" and "Reference Program" is assumed to be one (1) unit process. Namely, "Model Production" is defined to be one (1) piece of the unit process, so as to define a software program and a file, which are necessary for carrying out the work or operation. A vacant portion within the unit process; thus, an input file or the like of the process name, "Model Production", is a portion to be defined in a step S4 in the phase F2, and it is an item to be defined into the difference template. Also, the portion, in which data are described, means that they are the data to be used in the common template. However, in a case where the data are not used, the data within the unit process may be in vacancy. Herein, it is assumed that the contents of the unit process are "Process" "ENG Tool", "Input File", "Output File", "Reference File" and "Reference Program", as was mentioned in above, however there is no restriction on the data, nor restriction on the number of pieces of the unit processes, which can be defined therein. Next, an order or sequence of the processes is described on a step definition. This is similar to that of the working steps. Next, keyword, which is linked with the common template name and the common template, is described, as to be in a part of the data structure of the keyword. This is one, which is defined in the step S2. And with the difference template name and the keyword thereof, they will be mentioned in a step S7, later. In this manner, the common template and the keyword thereof are defined in the phase F1.

Figure 8:
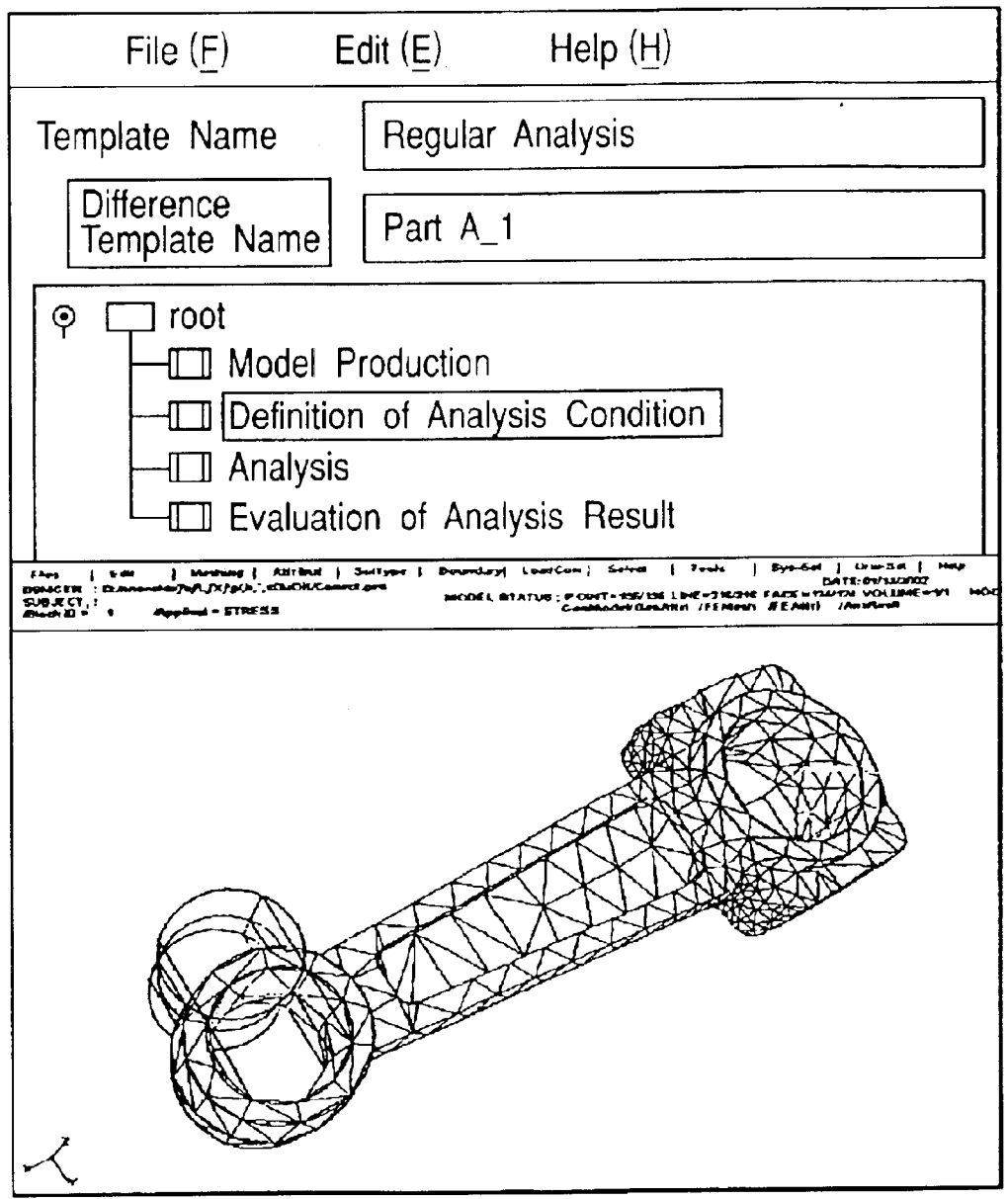
FIG. 8 is a view for showing an example of practicing the analysis work.

In the phase F2, the common template is read into by means of the template execution portion in the step S4, thereby executing the analysis. Herein, working is conducted by using the defined program and the input/output file, in accordance with the analyzing steps described in the "Regular Analysis" of the common template, as shown in FIG. 8. In the figure showing an example of "Definition of Analysis Condition" at work, the condition for analysis is defined with respect to the input file, "3DOut" (see, FIG. 6). In this manner, a series of analyzing works or operations are conducted in accordance with the contents described in the common template, which is read into.

Definitions are made in the step S4, in particular, on the data that are newly generated for each analysis; thus, those corresponding to the vacant portions within the data of the common template; such as, the analyzing result and the evaluation, etc., for example. Namely, when writing the new information (the data, and the reference file) into the common template, additionally, which are not yet described therein, a content additionally written into each process in the template, and also a calculation result in the process are registered for each process, to be the knowledge being peculiar or specific for this analysis, among the analysis that is executed by plural numbers of times. With this, the selection of data that is done by an operator for carrying out this analysis, the reference file(s) and/or the software program(s), and also the calculation result, which are obtained as a result thereof, are recorded, in the order of the processes, for each analysis. For this reason, the knowledge of the operator carrying out this analysis is recorded during this analyzing. Accordingly, since the knowledge is piled or accumulated up for one (1) analysis and/or process thereof; i.e., the knowledge is accumulated, on the manner of changing the size, the manner of changing the mesh accompanying with that change in size, and selection of the condition, etc., for example, when executing the analysis after a second time, while changing the sizes of the part A shown in FIG. 3, therefore it is possible to make the cause-effect relationship clear, in particular between the size change of the part and the analysis result, easily. Also, the knowledge can be used, effectively, when other engineer who tries to make the analysis, thereby improving efficiency on the work.

In the embodiment mentioned above, it is so constructed that the work or operation is proceeded or advance by selecting the common template, as an input into the template execution portion, however it is also possible to execute by reading the difference template into, which was already produced. In this instance, the content of the common template is not recorded into the difference template; therefore it is necessary to read the information of the common template into, with which the difference template refers, in addition to the difference template.

Next, in a step S5, the difference template is produced for this analyzing work. As is shown in FIG. 10, it is assumed that the name of the difference template is "Part A_1". The reason of naming "Part A_1" lies in that the consideration is paid on the fact of conducting the analysis in plural numbers of times even for the same part. The difference template production portion 104 records therein the data, the reference file, the reference program, the mesh model, the calculation result, the analysis result, etc., which are not described in the common template, for each process. This can be produced, by bringing the contents into the difference template, which can be obtained by subtracting all information described in the common template from all information of the template, on which the analysis is completed. And, it is also possible to produce this, through recording the data, which are newly added by the operator in each process or the like, in a time sequence thereof, and then collecting the recorded data or the like for each process, so as to distributing them into the difference templates, when completing the analysis.

Next, in a step S6, the definition is made on the keyword to be linked with the common and the difference templates. FIG. 9 shows an example of a screen for inputting the keyword. The name of the common template is "Regular Analysis", and the keyword linked with the common template is displayed on the keyword list. A keyword is selected for linking between "Part A_1", and "Regular Analysis" from the keyword list. Herein, "Part A" and "G1" are selected. In this manner, the present analysis work "Part A_1" is linked with the common template, "Regular Analysis", through the keywords, i.e., the "Part A" and "G1".

In a step S7, the difference template and the keyword are reserved in the difference template database and the keyword database, respectively. FIG. 10 shows the data structure of the difference template. Herein, the difference template name, the process name and the information thereof are described. The reason that the information is small in an amount thereof, in particular about the processes, lies in the fact that the information other than that defined in the common template is described, but in the difference template. Namely, the data are reserved; such as, the software program(s) necessary for the analysis, the know-how information to be used in common, and intermediate data, etc., are defined in form of the common template, while the input data necessary for analysis and the analysis result are in the form of the difference data. Ordinarily, the analyzing steps are considered to be the common data, therefore they are not described in the difference template. However, if there is a analyzing step, being unique or peculiar for a worker who is making the analysis, the process is described in the difference template, which is added or inserted into/from other than the common template.

FIG. 11 shows the data structure of the keyword. Though being similar to that shown in FIG. 7, there are described "Part A_1" defined onto the difference template name in the step S5, and "Part A" and "G1" defined onto the keywords in the step S6. Herein, plural numbers of difference template information are is described, to be that, on which the analysis work of the phase F2 is conducted repeatedly.

In the above, the phase F2 is a phase for the analyzing work. In an ordinary designing work, the parametric survey is conducted, in which analyzing is made on several times, while changing the shape and the physical properties of the analysis target, in various manners. In this instance, it is not necessary to change the analyzing steps, the software program(s) and the intermediate file name(s) thereof, and/or the know-how data, etc., for each repetitive calculation thereof. Then, while defining the portion of common work, the intermediate file, and the know-how, etc., in the repetitive calculation, to be the common template, the analysis work is conducted, repeatedly, by using the common template for the corresponding analysis work, in the template execution portion. In relation to the repetitive calculation, etc., the un-common portion is defined to be a part of the difference template, such as, the data and/or the analysis result obtained by changing the configuration, for example. With this, there is no necessity to produce and/or copy the template for each the repetitive calculation. Also, if the common template is changed or altered, it reflects on the information, directly in the difference template, which refers the common template. With conducting such the repetitive calculation in this manner, the phase F2 is carried out repeatedly, thereby producing the difference template only.

Explanation will be made about the phase F3. In a case where the analysis is conducted repeatedly, by using the common template, it can be said that there are the difference templates in plural numbers thereof. For instance, by taking the parametric survey in relation to the part A, for an example, the common analysis data of the part A belongs to the common template, while the data, such as, the analysis result of the part A, which is obtained by changing the configuration and the physical properties thereof, belong to the difference templates existing in plural numbers thereof. In this instance, the common template and the difference templates have a relationship via the keyword; such as, the common analysis data of the part A, the analysis input files, and the analysis result, for example. Herein, description will be made on the plural numbers of analysis results in relation to the part A; thus, dealing with the data, which are defined in the difference templates.

Figure 12:
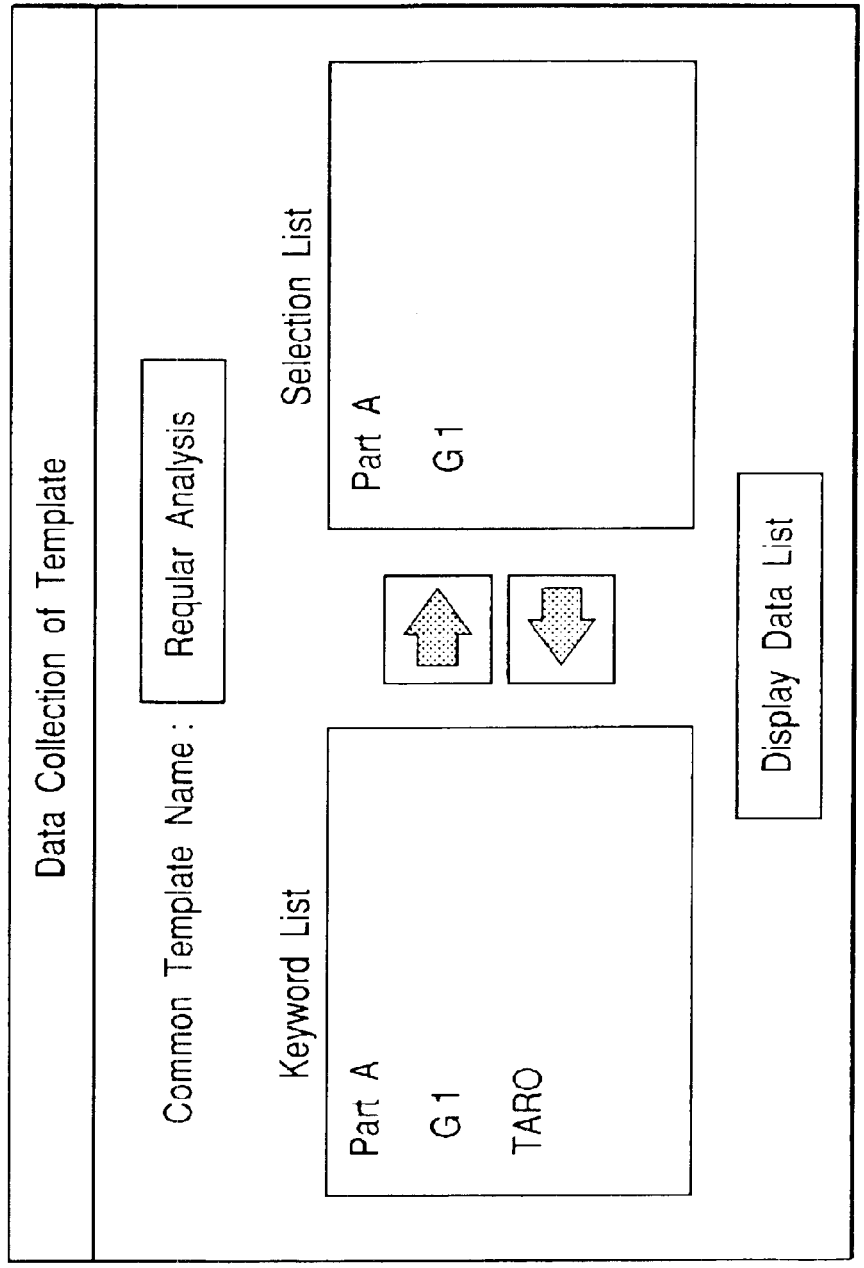
FIG. 12 is a view for showing an example of the display screen for inputting the keyword of the template information to be collected.

First, in a step S8, the common template is inputted, to be the target for data collection, through the template information display portion. An example of a screen for inputting the keyword of the template information is shown in FIG. 12. Herein, the "Regular Analysis" is already inputted. Then, the keyword connected to the common template is displayed on the keyword list. Next, in order to determine the difference template, from which the data should be colleted, the keyword is selected, which is linked with the difference template to be collected. Herein, the "Part A" and "G1" are inputted.

In a step S9, the common template inputted and the difference templates linked with the selected keyword are searched out from the common template database and the difference template database, and those data are read into. In this instance, since the name of the difference template can be seen, by using the keyword database, as shown in FIG. 11, it is possible to collets the difference templates.

In a step S10, the analysis information collected is displayed. An example of this display screen is shown in FIG. 13. There are displayed the common template name, i.e., "Regular Analysis", and the selection keyword, i.e., "Part A" and "G1". Namely, there is displayed a list of analysis data, which are obtained through conduction of the analysis work by referring to the common template "Regular Analysis", and in the difference templates of which are defined the key words "Part A" and "G1". In the first column of a table, there are described the information defined in the unit processes, such as, "Process", "ENG Tool", "Input File", "Output File", "Reference File" and "Reference Program", in the form of one (1) set; i.e., being displayed four (4) unit processes, which are defined in the templates. The second column displays the data, which are defined in the common template.

Herein, a mark "/" means not being defined in the common template, and therefore it has no data, or has the data, but in the difference template. On columns from the third (3$^{rd}$) to the sixth (6$^{th}$), there are displayed the information of the common template "Regular Analysis", and the difference templates, each having "Part A" and "G1" in the keyword thereof. In the figure, there are shown four (4) pieces of the difference templates, such as, "Part A_1", "Part A_2", "Part A_3" and "Part A_4", and this means that the parametric survey is conducted by four (4) times. A mark "_" in the table indicates that the data of the common template must be referred to.

Thus, by taking the "Part A_1" for an example, the process name and the ENG tool are used, which are described in the common template, however as the input file, the "Part A1" is uses. Also, "Parts Information A" is defined as to be the reference file, and it is so determined that "Editor" should be used, as the software program, for making references thereto. Also, "Producing Method" and "Web Brower" are defines in the reference file and the reference program of the common template, respectively, and this indicates that those information can be referred to in the template execution portion, for all of those from "Part A_1" to "Part A_4".

In this manner, the analysis information, which is obtained through the parametric survey, can be collected by means of the keyword in the phase F3, and also the condition of the analysis can be seen at one glance, by displaying them in a form of the list thereof. It is also possible to divide the difference templates into groups, by selecting a keyword for linking between the difference templates, from the keywords linked with the common template. As is shown in FIG. 11 for one example, the data structure of the keyword can be divided into the one group of the difference templates, each having the "Part A" and "G1" therein, and the other of the difference templates, each having the "Part A" and "TARO" therein.

In the embodiment mentioned in the above, though explanation was made on the apparatus, being the work assistance apparatus, however the present invention can be sold in the form of software for use in the work assistance apparatus, by memorizing the software programs of the common template production portion 101, the common keyword setting portion 102, the template execution portion 103, the difference template production portion 104, the difference keyword setting portion 105, and the template information display portion 106, into a memory medium, such as, a CD-ROM, a DVD-ROM, etc., for example. In this instance, the databases can be produced, by providing the program for automatically regionalizing a hard disc connected or associated with the computer, into which that software is to be installed, for each portion.

According to the present embodiment, since the address information of the difference templates are also descried in the keyword database, together with the names thereof, it is possible to collect the data of the template files even if the difference template files are stored in a distributed manner. The table shown in FIG. 13 is displayed; therefore, it is easy to execute the software program and/or to refer to the know-how data. Thus, connection between the databases and servers through a network enables the operators to operate of the template execution portion, from plural numbers of locations, each being separated therefrom.

With using an optimized engine, the repetitive analysis portion can be automated through the optimizing calculation. In this instance, it is necessary to produce the difference template for each parameter. The apparatus according to s the present embodiment can be used, not only in the repetitive analysis, but also in a single analysis. In this instance, it is the same to the case where the phase F2 is executed by only one (1) time.

By registering the software program(s) necessary for the analyzing steps and the analyses, as well as, the know-how data, into a server of an undertaking of providing information, in the form of the common template, it is also possible to build up a business model, in which companies other than that undertaking can use them through a network, such as, the Internet, for example.

As was mentioned above, according to the present invention, since the template is divided into a common portion and an un-common portion, there is no is necessity to produce the template newly, and/or to copy the template, in the case when conducting a plural number of analyses. When the data of the common template is renewed, the information directly reflects upon the difference template(s), therefore it is possible to reduce the number of the working steps accompanying with such the alternation or change. Also, linking between the common template and the difference template(s), by means of the keyword independent from the templates, enables the collection of the template information, as well as, division of the difference templates into those groups.

As was mentioned in the above, according to the present invention, though the explanation was made in relation to the analyzing works of conducting the analysis repeatedly, however the present invention can be also applied to any kind of works, if the plural number of processes thereof is to be conducted in time sequence, with using the computer (i.e., a result can be obtained in the process of a rear-stage, by using the result that is obtained in the process of a pre-stage), and if the working steps include the work having wide compatibility or flexibility (i.e., the work, which can be widely generalized for a person who is in charge of that work, even if it is special kind of working).

For example, the present invention can be applied into a planning work for producing a travel plan, for example, in a travel agent company. The processes thereof may includes: a process of inputting a rough plan of traveling, a process for realizing that travel plan, through searching out tourist spots or the like at each designation of the traveling, with using the various databases, a process of producing a traveling schedule by using a route searching system and/or a time searching system, a process of calculating out costs by using a fare calculation system and/or a cost database of a bus company, and as the end, a process of producing a pamphlet or brochure, by attaching a schedule and the costs and/or pictures of the destinations, there is.

The operator inputs a rough proposal of the travel plan, which she/he plans by her/himself, by opening the common template for producing the travel plan. Also she/he registers pictures and explanation of the spotlights at various places, and so on, by opening the various databases. Next, she/he determines the traveling schedule, by looking up the route and the time necessary for moving between the points, or replacing the order of the traveling. Then, she/he calculates out the costs necessary for the traveling plan determined, and if it can be accepted to be a plan, she/he produces the pamphlet, in a pamphlet production process. On the other hand, if deciding that the plan cannot be accepted, she/he registers that travel plan in the form of the difference template, and then enters into study of a next plan. If the next plan is similar to the last plan, she/he can make up the next plan without newly producing thereof, but by opening the difference template of the last plan, and also putting it into the common template. Then, by registering the travel plan into the database in the form of the difference 10 template, so as to be referred by other planners, it is possible to use the know-how of the planner who made up that planning in advance, effectively. Of course, the reason of decision can be described in the difference template of the traveling plan, why it is not accepted to be the plan, thereby being able to be accepted as a new traveling plan, again, if the reason is dissolved at the time of is the next decision.

In this manner, according to the present invention, with the apparatus, wherein a series of operations must be conducted on the computer flows, sequentially, while referring to various databases and software programs, on the way of the working processes, thereby executing the work repeatedly, by plural numbers of times, for obtaining a final product; such as, the optimal configuration of the part A, for example, in the embodiment mentioned above, or the travel planning acceptable to be a plan, for example in the travel agent company, as was mentioned above, it is possible to obtain the final product, while achieving accumulation of the know-how, as well as the using thereof.

According to the present invention, it is possible to provide an assistance apparatus for assisting works with using a computer therein.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraced therein.

What is claimed is:

1. A work assistance apparatus with using a computer therein, comprising:

a common template producing portion for producing a common template in which work is defined for each of a plurality of processes identified in said common template and in which said processes form a series of process along with steps thereof; and a difference template producing portion for recording therein information, which is necessary for advancing the work, but not described in said common template, for each of said processes, wherein an operation to be conducted includes a series of works, and wherein efficient execution of said operation is performed by allowing collaboration between said series of works based on said common and difference templates.

2. A work assistance apparatus with using a computer therein, comprising:

a common template producing portion for producing a common templates in which work is defined for each of a plurality of processes identified in said common template and in which said processes form a series of steps;

a difference template producing portion for recording therein information, which is necessary for advancing the work, but is not described in said common template, for each of said processes; and means for memorizing a keyword for relating between said common template and said difference template, wherein an operation to be conducted includes a series of works and wherein efficient execution of said operation is performed by allowing collaboration between said series of works based on said common and difference templates.

3. A work assistance apparatus with using a computer therein, comprising:

a common template producing portion for producing a common template in which work is defined for each of a plurality of processes identified in said common template and in which said processes form a series of steps;

a difference template producing portion, for recording therein information, which is necessary for advancing the work, but not described in said common template, for each of said processes;

means for memorizing a keyword for relating between said common template and said difference template; and means for displaying content of at least one difference template, which is searched by use of said keyword, in a form of a list.

4. A memory medium for use with a computer, memorizing therein information for performing predetermined steps with an aid of said computer, comprising:

a common template producing portion for producing a common template, in which information necessary for work is defined for of a plurality of processes identified in said common template and in which said processes form a series of work steps;

template execution means for executing the work using said common template; and difference template producing means for producing a difference template by taking therein information, which is not described in said common template, as a result of execution of the work, wherein an operation to be conducted includes a series of works, and wherein efficient execution of said operation is performed by allowing collaboration between said series of works based on said common and difference templates.

5. A memory medium for use with a computer, memorizing therein information for performing predetermined steps with an aid of said computer, comprising:

a common template producing portion for producing a common template in which information necessary for work is defined for each of a plurality of processes identified in said common template and in which said processes form a series of work steps;

template execution means for executing the work using said common template;

difference template producing means for producing a difference template by taking therein information, which is not described in said common template, as a result of execution of the work;

a common keyword setting portion for giving a keyword to said common template; and a difference keyword setting portion for giving a keyword to said difference template, wherein an operation to be conducted includes a series of works, and wherein efficient execution of said operation is performed by allowing collaboration between said series of works based on said common and difference templates.

6. A memory medium for use with a computer, memorizing therein information for performing predetermined steps with an aid of said computer including a display, comprising:

a common template producing portion for producing a common template in which information necessary for work is defined for each of a plurality of processes identified in said common template and in which said processes form a series of work steps;

template execution means for executing the work with using said common template;

difference template producing means for producing a difference template by taking therein information, which is not described in said common template, as a result of execution of the work;

a common keyword setting portion for giving a keyword to said common template;

a difference keyword setting portion for giving a keyword to said difference template; and a template information display portion for displaying content of at least one difference template, which is searched by use of said keyword, in a form of a list.

* * * * *